(12) United States Patent
Richter (10) Patent No.: US 8,289,169 B2
(45) Date of Patent: Oct. 16, 2012

(54) SIGNAL PROCESSING SYSTEM AND COMPONENTS THEREOF

(75) Inventor: Wolfgang Richter, Starnberg (DE)

(73) Assignee: Ident Technology AG, Wessling (DE)

( * ) Notice: Subject to any disclaimer, the term of this patent is extended or adjusted under 35 U.S.C. 154(b) by 849 days.

(21) Appl. No.: 12/443,012

(22) PCT Filed: Oct. 1, 2007

(86) PCT No.: PCT/EP2007/008525
§ 371 (c)(1),
(2), (4) Date: Mar. 26, 2009

(87) PCT Pub. No.: WO2008/040517
PCT Pub. Date: Apr. 10, 2008

(65) Prior Publication Data
US 2009/0315710 A1  Dec. 24, 2009

(30) Foreign Application Priority Data

Sep. 29, 2006  (DE) .......................... 10 2006 046 515

(51) Int. Cl.
*G08B 23/00* (2006.01)
(52) U.S. Cl. ...................... 340/573.1; 340/521; 340/522
(58) Field of Classification Search .................. 340/521, 340/522, 573.1, 573.4, 573.7, 426.24, 426.25, 340/439; 180/271, 273, 275; 250/208.1, 250/221; 701/33.7, 45; 280/730.2, 735
See application file for complete search history.

(56) References Cited

U.S. PATENT DOCUMENTS

| | | | | |
|---|---|---|---|---|
| 6,116,638 A | * | 9/2000 | Hosoda .......................... | 280/735 |
| 6,123,357 A | * | 9/2000 | Hosoda et al. ............. | 280/730.2 |
| 6,161,070 A | * | 12/2000 | Jinno et al. ...................... | 701/45 |
| 6,556,903 B2 | * | 4/2003 | Chinigo et al. .............. | 701/33.7 |
| 6,822,573 B2 | * | 11/2004 | Basir et al. ..................... | 340/575 |
| 7,164,117 B2 | * | 1/2007 | Breed et al. ................... | 250/221 |
| 7,575,085 B2 | * | 8/2009 | Kamizono et al. ............ | 180/273 |
| 7,589,637 B2 | * | 9/2009 | Bischoff et al. ............ | 340/573.1 |
| 2003/0158643 A1 | * | 8/2003 | Murphy et al. ................. | 701/45 |

* cited by examiner

*Primary Examiner* — Van T. Trieu
(74) *Attorney, Agent, or Firm* — King & Spalding L.L.P.

(57) ABSTRACT

A sensor system for generating control signals is provided, and the control signals being used for setting switching states, a user located in the region of the sensor system acting as a signal transmission structure. The sensor system comprises: a first sensor component having a sensor, a local-key switch and a signal extraction switch for generating a partial signal whose information content is indicative of a sensor event detected by the sensor, a second sensor component also having a sensor, a local-key switch and a signal extraction switch for generating a partial signal whose information content is indicative of a sensor event detected by the sensor of a signal requestor component that comprises an interface device via which an extraction of seek signals searched in the mentioned user and an introduction of partial signals from the user in the interface device is carried out, wherein the local-key switch associated to each sensor component is configured in such a way that the partial signal carries an information content that allows the partial signal to be allocated to the respective sensor component. It is thus advantageously possible to detect the signals of several sensors without the need of specific direct wirings between the sensor components and the signal requestor component.

17 Claims, 7 Drawing Sheets

SIGNAL PROCESSING SYSTEM AND COMPONENTS THEREOF

CROSS REFERENCE TO RELATED APPLICATIONS

This application is the US national phase of PCT application PCT/EP2007/008525, filed 1 Oct. 2007, published 10 Apr. 2008 as WO2008/040517, and claiming the priority of German patent application 102006046515.6 itself filed 29 Sep. 2006, whose entire disclosures are herewith incorporated by reference.

BACKGROUND AND SUMMARY OF THE INVENTION

The invention relates to a signal-processing system, and also to the individual components of this system per se. The invention relates in particular to a signal-processing system that can obtain signals within an operating range of a user on the basis of which switching states can be set that correlate with actions, gestures, positions or other actions applicable to the switching state for the user.

In the present context the term "sensor" in particular means switches, elements for detecting pressure, temperature, brightness, and forces as well as devices capable of detecting states and if required changes in state. To date it has been usual to detect switch actions of a user via sensors, switches in particular. These sensors are typically connected to a controller that processes the switching signals.

An effort is normally made to detect corresponding signals with the least possible circuitry and cabling outlay. This applies in particular white goods (e.g. washing machines, dishwashers, stoves, etc.) as well as motor-vehicle equipment and fittings, e.g. motor-vehicle seats, steering wheels, etc. Different sensors, which for example create an overall physical image of specific situations, must be interconnected. This is done via bus systems, or if required also wirelessly by radio technology, the sensors being in some cases equipped with their own power supply (batteries, power cells).

The object of the invention is to provide solutions that make it possible to solve a number of sensor problems in a limited space in a cost-effective manner with relatively little circuitry.

This object is attained according to the invention by a sensor system for generating control signals that are employed for setting switching states, whereby a user located in the region of the sensor system acts as signal-transmitting structure, with:

a first detector comprising a sensor, a local-key circuit and a signal-outputting circuit for generating a tell signal including data corresponding to a sensor event detected by the sensor, a second detector also comprising a sensor, a local-key circuit and a signal-outputting circuit for generating a tell signal including data corresponding to a sensor event detected by the sensor, a signal requester comprising an interface that outputs seek signals into the user and receives tell signals from the user, the local-key circuit assigned to each detector being configured in such a way that the tell signal carries information content that enables assigning of the tell signal to the respective detectors.

This makes it advantageously possible to detect the signals of several sensors without special direct wiring between the detectors and the signal requester being required for this very purpose.

The tell signal is preferably time-offset from the seek signal. It is possible for the individual detectors to provide different delay windows to enable substantially collision-free data feedback. The length of delay can constitute the identifier specified by the local-key circuit.

It is also possible to emit the tell signal at least phase-wise at the same time as the seek signal. The tell signal can be routed back by impedance modulation to the interface of the signal seekers.

One of the detectors can be addressed preferably by the seek signal. Power can be supplied to the detectors via the seek signal.

In generating the sensor signal as proximity sensor signal it is possible in particular to generate the sensor signal, e.g. via level detection via the seek signal.

In using the inventive sensor system in a motor-vehicle seat in particular it is possible for at least one of the sensors to be a pressure sensor. The sensor system can be at least partially integrated directly into the motor-vehicle seat or seating space. It is possible in particular to provide the signal requester in the region of the center console so that it transacts a signal dialog via the thighs of the seated user. The pressure sensors sit at the appropriate points of the seat, in particular as a sewn-in or mounted flat module. Seat occupancy can be determined via the sensor system. An air-bag system can be controlled according to this seat occupancy discrimination.

The system can comprise several signal requesters that can also dialog with one another, for example for determining addresses of the detectors.

The interface preferably comprises a transmitter electrode and a receiver electrode, both electrodes being spaced from one another.

The local key of the respective detectors can be specified preferably by the signal requester. The response characteristic of the respective sensors, in particular a response delay, can be specified preferably via the signal requester.

The invention operates wirelessly, contact-free and without the detectors requiring their own power supplies. In contrast to a selective mode of operation the invention advantageously operates simultaneously. People and their actions can particularly be an essential constituent of the sensor network.

The detectors can include physical pickups for power, voltage, temperature, pressure, moisture, and vibration that are powered only by the query signal. The detectors can also be configured such that they are capable of "energy harvesting," whereby the electric supply is achieved by converting mechanical or other physical environmental effects (piezo, induction etc.) Such sensors are often fitted with a communications mechanism. Using protocols it is possible to set and/or query these sensors also cyclically according to a specific scheme.

With the inventive concept it is possible to build quasi self-organizing sensor networks by cost-effective circuits, there being advantageously practically no costs for cabling, plugs or batteries. The network can operate simultaneously and can be powered and queried wirelessly. This can eliminate expensive (and thus cost-intensive) protocols. Due to the simplicity of the circuit layout it is possible in the future to print such sensors on polymer films and to attach these by adhesive at the points to be monitored. The invention works without wires and is capable of wirelessly transmitting the sensor information simultaneously to an evaluation unit (server) that tends the sensors in its vicinity by electric (or electromagnetic) alternating fields. Changing the field strength makes it possible to switch sensors on and off, or to perform switching procedures. It is also possible for the sensors to be activated by a person in their proximity. This can happen as an intentional conscious action or automatically by a certain spacing of the sensors.

The invention is multifunctional. It uses a metallic or otherwise conductive connection as supply, sensor and communication element. Also conductive fibers (e.g. carbon) are used for this purpose. Since all sensors operate simultaneously it is possible for the server to create a status diagram that can be evaluated for example by way of Fourier transform analysis (FFT). Since the sensors are powered (and queried) by at least one electric (or electromagnetic) field, changes in the dielectric can also be made and evaluated. The invention therefore preferably has a level-responsive operating method (it can however also work by frequency or phase shift and pulse widths). The invention also allows several servers to be utilized at the same time. Since the sensors are powered by the electric field and queried at the same time, the latter can be checked continuously for correct function (sensor "OK" signal). Due to Faraday effects it is possible to act within an inertial space, e.g. inside a machine. The sensor transmission function does not reach the outside and accordingly cannot disturb other appliances, something not always guaranteed with radio.

Further details and characteristics of the invention will emerge from the following description with reference to the drawing, in which:

DETAILED DESCRIPTION OF THE INVENTION

Figure 1:
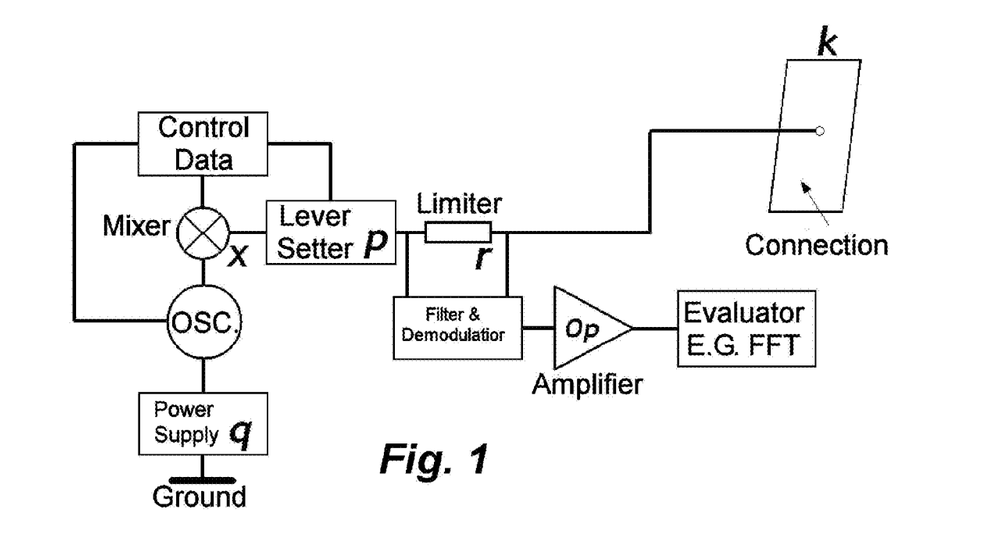
FIGS. 1 to 4, as well as 10 and 11 are circuit diagrams showing details of the components of the inventive system.

FIG. 1 shows an inventive circuit layout for the server (signal requester). A power source q supplies electrical energy in a specific manner, e.g. as direct current. This drives an oscillator (osc.) that can generate an alternating voltage (e.g. 200 kHz). This alternating voltage goes to a mixer x. Data for sensor control can also be fed to this mixer via a control block, for example. The mixed signal reaches a level stage p, where the level can be adjusted to a specific magnitude by appropriate circuitry. For example, a simple series resonance circuit would allow the level to be increased by a specific factor to then generate an electric field with sufficient transmission range. A downstream limiter r, e.g. a resistor, prevents current from exceeding a specific magnitude, for example in the event of a short circuit. On the other hand, this very element forwards the modulation generated by the sensors driven in the circuit of the electric field to at least one evaluation unit. This essentially comprises a simple filter (e.g. low pass, a differential amplifier and/or a transimpedance amplifier) and forwards the filtered sensor signal that can be a mix of different frequencies of varying amplitudes, for example a Fourier transform FFT. The evaluation can likewise take place by neuronal networks or digitally by acoustic decoders. To deliver the electric field and to receive modulation of the sensors, at least one connection k is provided that can comprise for example a film-like structure that in turn is made of conductive material (metal, plastic, carbon fiber, etc.) It is of particular significance that this connection k can also comprise a resistive (e.g. carbon fiber) material and contains the inventive limiting resistor r, which in turn can prove cost-effective. It is likewise possible to focus the electric fields with a needle as strong point loading to detect specific sensor areas. Several servers can be put in one inertial space (machine, vehicle, etc.) Different frequencies can also be used at the same time or successively, all of which are set below a certain limit, e.g. 1 MHz, to avoid electromagnetic scattering. The invention is thus a near-field communication device. Through frequency change during operation it is also possible to check the body impedance of a person located in the sensor field (and thus the field itself).

Figure 2:
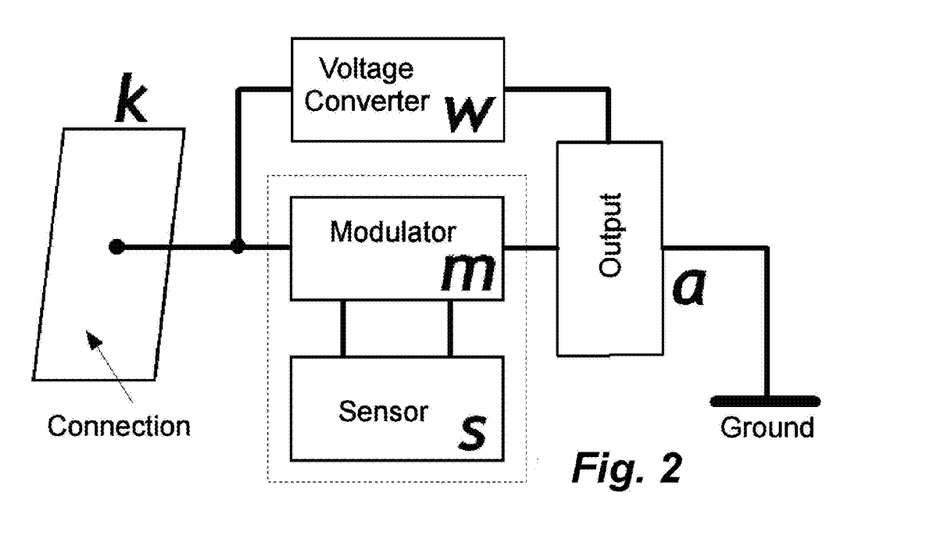

FIG. 2 shows an advantageous circuit layout for a sensor-client (detector). Since the present case is a capacitive (and/or electromagnetic) coupling, the size of the connection between server and client and the distance between them determines the input energy. This is an essential difference from radio systems, in which the signal is transmitted by an antenna that must have a constant physical corresponding dimension due to wavelength. The dielectric between the connections is also of significance, particularly if it can be changed, such as foam in a vehicle seat that is pushed in by the weight of a person. The alternating field absorbed by the connection k is converted into a DC voltage with an AC/DC converter w. This can happen for example in addition via a diode cascade to generate a correspondingly high working voltage from the input signal, in addition to rectification. This voltage drives at least one oscillator m that preferably has a lower frequency than the incoming alternating voltage signal. The reason for this is that it is easier to evaluate low frequencies, e.g. by a Fourier transform, since the evaluation is also to be carried out cost-effectively, e.g. with 8-bit microprocessors that often do not allow rapid computation. According to the input voltage the oscillator has a certain level with which the input voltage, which is alternating voltage, can be modulated. A modulator is available for this that actually comprises the oscillator itself and appropriate connection to the power supply. It is possible to alter the level of this voltage (LF) by electric conversion s of physical magnitudes of effect such that it can be evaluated proportionally to the affecting size on the server and thus forms a measure for the affecting size. It is also possible to configure the LF oscillator as VCO so that it can change its frequency corresponding to an effect (to be proven). Activating a client therefore occurs whenever there is adequate field strength such that the oscillator is excited, which can be evaluated at the same time as the above-mentioned "sensor Ok" signal. The absence of such a signals would be recognizable in the FFT spectrum of the evaluation as an obvious gap. Any number of oscillators or clients can be present contiguously or spatially separately in an electric (or electromagnetic field) and addressed. Depending on distance, different LF oscillator voltages occur, which should be distinct for each client, slightly different in their frequency, for example divided into 100 Hertz increments (acoustic frequency). In an inertial space (this is the space that has e.g. a common ground and/or can be reached via a provided electric (or electromagnetic) field, e.g. the interior of a washing machine) it is therefore possible to activate many sensor clients and to operate and query them simultaneously after activation.

Figure 3A:
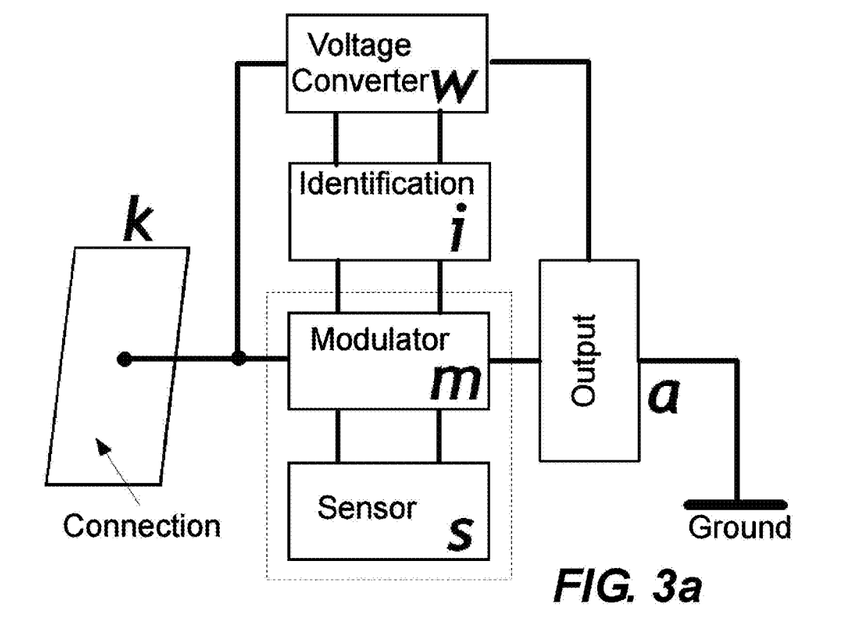
Figure 3B:
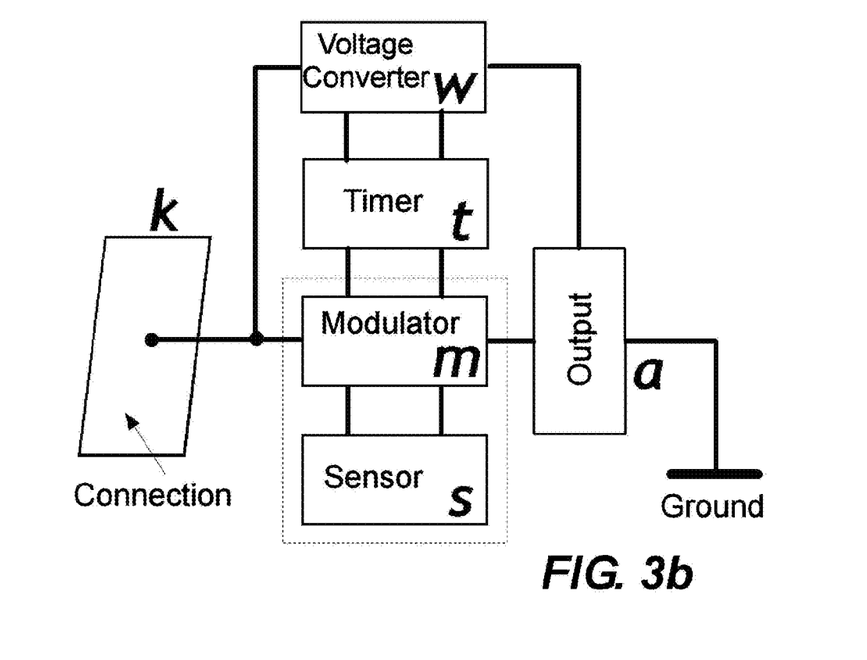
Figure 3C:
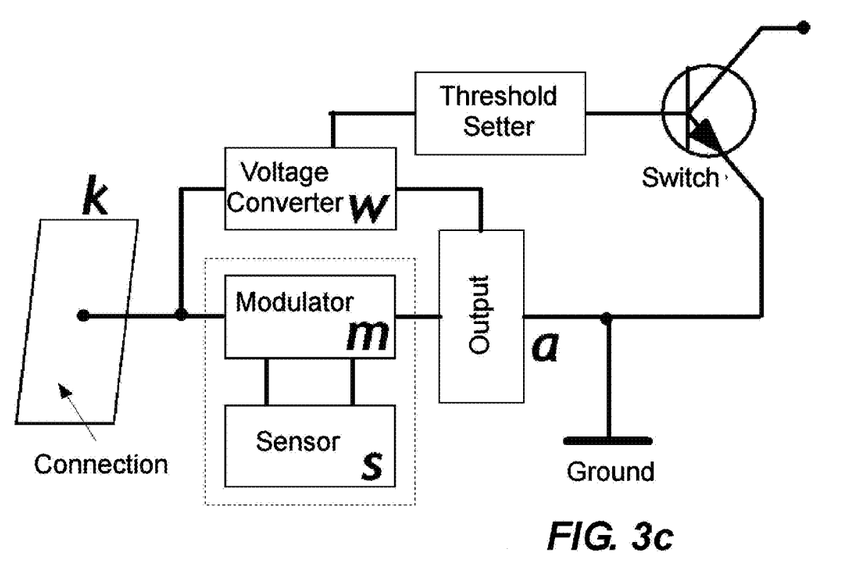

It is also possible to provide within the individual sensor clients at least one comparator i that compares an identification number delivered by the server and activates the sensor and/or modulator part of the client only when there is a match (FIG. 3). This would make all sensor clients located in an electrical (or electromagnetic) field individually addressable. The sensors would then modulate their measured values as described to the carrier signal until the latter is interrupted. The identification gets lost and the energy to run the sensors is lacking. It is a very simple possibility to check any number of sensors within an inertial space. On return of the carrier signal from the server one client (or more) can be selected again. For reasons of cost this possibility is often omitted, i.e. all clients who are supplied by the electric field will transmit their level-dependent sensor frequency. This leads to a frequency mixture that can be evaluated by e.g. FFT Fourier transform (for example in the server or also separately). It is also possible to filter a specific frequency from the servers using acoustic decoders and to observe these, in case this is required. It is likewise possible to have a sensor-client operate by a timer (e.g. R/C) (FIG. 3b) at a specific time following receipt of a carrier signal. This timer can also be formed by the DC voltage growing in cascade, which switches the oscillator on from a determinable switching threshold (e.g. Schmitt trigger). This makes it possible to receive temporally coordinated sensor signals from different clients on output of the carrier signal. Shut-off happens simultaneously here also when the carrier signal drops out. Naturally, it is also possible to limit the mode of operation in the case of a continuous carrier signal by a cutout timer in the client. Since a sensor-client comprises only a few components (connecting face, AC/DC cascade, LFO, variable resistance or variable capacity), it should be possible to apply the latter typographically to polymer films by the latest technique. These films can be bent and wound to produce a specific characteristic of sensor technology, which proves particularly advantageous. This becomes even clearer in the examples. It is also possible to design such detectors as a chip and to embed them in conductive polymer films. Such a detector is also suitable for nanotechnology, since it is possible to manufacture the required semiconductor structures, diodes and transistors in the future on the molecular level and to develop the corresponding circuits from them. Due to the minimal circuit requirements it is possible to shape such detectors that they can be stacked. Normally, the sensor clients are connected galvanically or capacitively to a pole in the inertial space to earth (or otherwise), so that a closed alternating voltage circuit is formed between the server and the clients. This connection to ground can however also be completed e.g. by a person (FIG. 10), if he touches an ungrounded client at its ground connection. Grounding happens capacitively via the body of the person. Such a sensor can also act as a wireless key substitute or as a touch-activated sensor. The invention is also shown in a few relevant examples below. It is also possible to initialize switching procedures via the sensor clients (FIG. 3c). By way of for example a biased switching step that can be activated by a briefly raised input level via a threshold value fixer (comparator, Schmitt trigger etc.) or a carried-over switch signal (by comparison).

Figure 4:
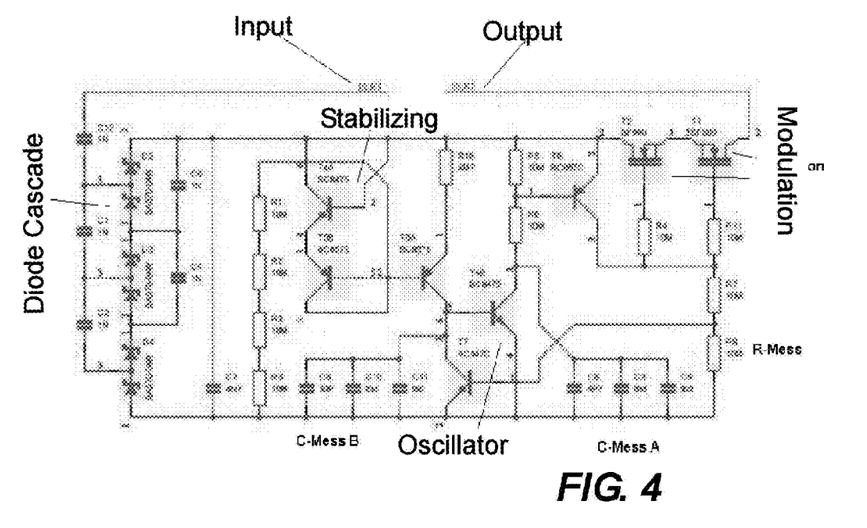
Figure 5:
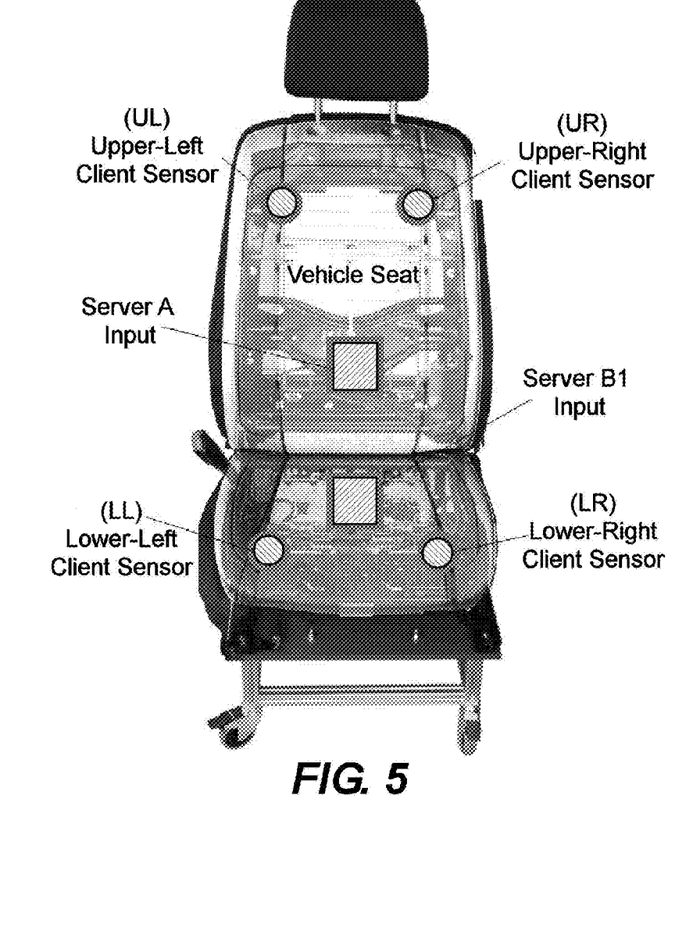
FIGS. 5 to 9 illustrate use of the inventive concept in a motor-vehicle seat.

FIG. 4 shows a concrete circuit example for a sensor client. In order to acquire the least possible necessary operating voltage for the sensor client, all its user branch currents are to be set as low as possible on the one hand, and on the other hand the current voltage transformation of the used diode cascade is to be designed especially in its output transmission factor in low available source currents; the illustrated design (FIG. 4) of this diode cascade (D2, D3, D4, C12, C1, C2, C6, C4, C7) should achieve these goals.

For the most pronounced load modulation on a generator functioning as power supply the entire network of the sensor client is separated from the source by T1 and T2—for this, both depletion MOSFETs are switched antiserially to achieve maximal disconnection in an alternating current circuit. The client transmits its 1-bit-wide information by an amplitude-modulated low frequency (e.g. 100 Hz).

T4B, T6 and T7 are used to generate this low-frequency "tone;" in its interaction a pulsed voltage sequence is generated at the collector of T6, the pulse width is set by C8 in sum with C3 and C5 and the pulse repeat frequency with C9 in sum with C10 and C11.

So that the tone has the least possible frequency fluctuation depending on the loading quantity stored by the server, it is necessary to set the loading procedure of C9 etc. independently of the voltage at C7. This brings in the network T4A, T5A and T5B with its wiring, which sets the collector current via the current level transistor T5A all but uninfluenced by the voltage level at C7.

Another way of optimizing the sensor client designs is the minimizing of the delay time between exciting the client to emitting "its tone." For this, the charging time for the necessary operating potential must be minimized with the block capacitances in the client; insufficient block capacitances lead to an interfering ripple in the operating voltage, which constantly counteracts the target output variable. To confront this ripple in terms of circuit design, its design is configured such that on the one hand the available source current in the through-switching phase flows directly from T4B and T6 to the latter (T1 and T2 are switched through at this time), and on the other hand the amplitude modulation in the client is produced not by load maximizing, which would always lead to a perceptible breakdown of stored energy in the circuit, but according to the invention by load minimizing, which means a long possible lingering of the energy in the circuit elements.

The most important electrical properties of the described circuit are:

| | |
|---|---|
| minimal terminal operating voltage at the connection | UKmin: ca. 1.5 Vss |
| typical terminal operating voltage | UKtyp: 2 Vss . . . 4 Vss |
| maximal terminal operating voltage | UKmax: ca. 10 Vss |
| rating at UKtyp = 3 Vss | only ca. 0.5 µW |
| carrier frequency range F(T): | <100 KHz . . . >200 KHz |
| adjustable frequency range of the tone F (Mod): | ca. 100 Hz . . . 1000 Hz |
| frequency drift D ∆F (Mod) (from 2 Vss to 4 Vss): | <±10% |

Advantages of the Invention Compared to Conventional Systems

The invention is wireless (no radio!) and preferably works with an electric alternating field (E field; B field possible) middle frequency (e.g. 200 kHz). The sensor clients work contactlessly, depending on the dielectric, the size of the connections and on the feeding field level. All sensor clients work at the same time. A simple channel setting is made for each client by a single resistor. The invention thus acts in a self-organizing manner. In the process, the organization can depend on the dielectric, the connections or the distance of the connections from one another, on the feeding field level and on sensor-relevant situations. The invention is also self-sustaining. It needs no batteries, and using storage batteries (or goldcaps) is possible e.g. as buffer. All sensor clients contain an integrated voltage converter w that can convert the electric alternating field into DC voltage at an adequate level (e.g. cascade). The system needs minimal hardware. A maximum of 6 diodes, 5-8 transistors, 10 condensers and 10 resistors is needed for a client for example. In this way the invention is suitable to be applied to polymer films etc. typographically miniaturized. A foldable film with integrated connections could arise in the film pressure. The sensors could thus be placed invisibly in vehicle or other seats, in steering wheels, in screws or under covers or behind panels.

EXAMPLE OF OPERATION OF THE INVENTION

The server (as per FIG. 1) initially generates an electric field by driving a generator (oscillator) via a power supply q, which in turn acts on a level converter p. The electric field is delivered to a connection k of a current limiter r. It is possible (though not mandatory) to differentiate the output of this field in a feeding and a query cycle. Located within the scope of the electric field are the sensor clients (as per FIG. 2) with their connections k. When there is sufficient level, DC voltage occurs at the diode cascade w, until a working threshold is attained. It is possible here to supply the sensors continually or to switch them off by interrupting the field or the supply and to set the work duration by way of a timer (as per FIG. 3b). The generator (oscillator) m located in the sensors generates a frequency that is preferably lower than the feeding frequency. This frequency can be stable to provide evidence that a sensor is in range e.g. to ascertain whether a valve is open or closed. The amplitude can likewise be level-dependent. This level depends on the distance from the feeding field and from the dielectric or its interference. The amplitude can also be set sensorialy, depending on physical effects, in case this is necessary. In all, only a few p-amps are needed to run a sensor client. The oscillator-signal modified in amplitude by physical effect is modulated appropriately and is decreased and optionally also amplified at the server (FIG. 1) on the limiter resistor r by filtering, e.g. via mixer and deep passes. The amplitude mix can be filtered by a band pass (or other appropriate filtering measures) in addition and forwarded to analysis, e.g. Fourier transform (FFT), wavelets, DFT etc. This results in simultaneous evaluation, similar to a type of matrix demodulation, and the possibility of evaluating all events acting on the sensors as status diagram (cf. FIGS. 5-9). This can also occur by way of matrices or neuronal nets. It is likewise possible to select and check an individual frequency range by a tunable filter (e.g. PLL), in case this is required. In case there are timers in the clients (FIG. 3b), these can be adapted to the measuring task.

EXAMPLE OF USE

Figure 6:
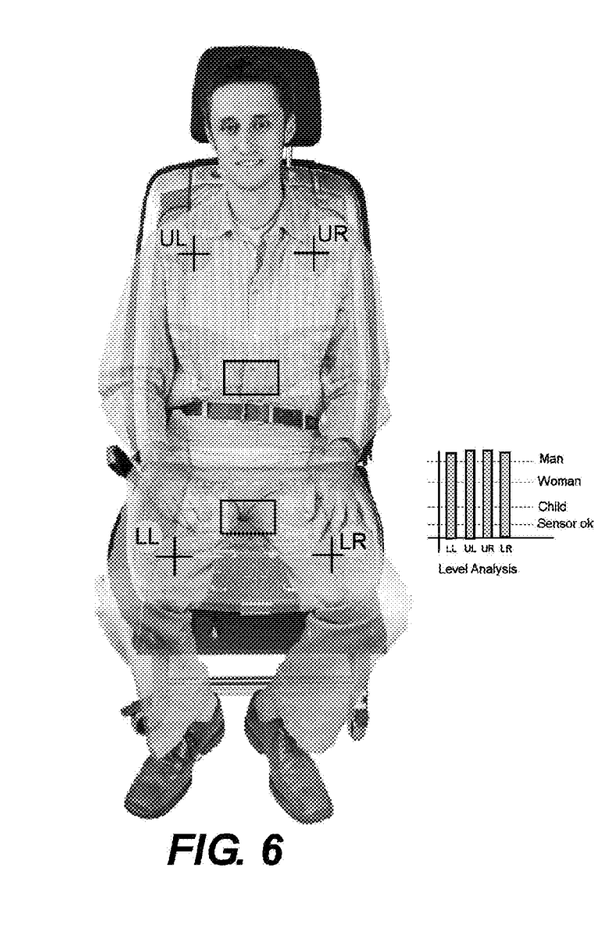
Figure 7:
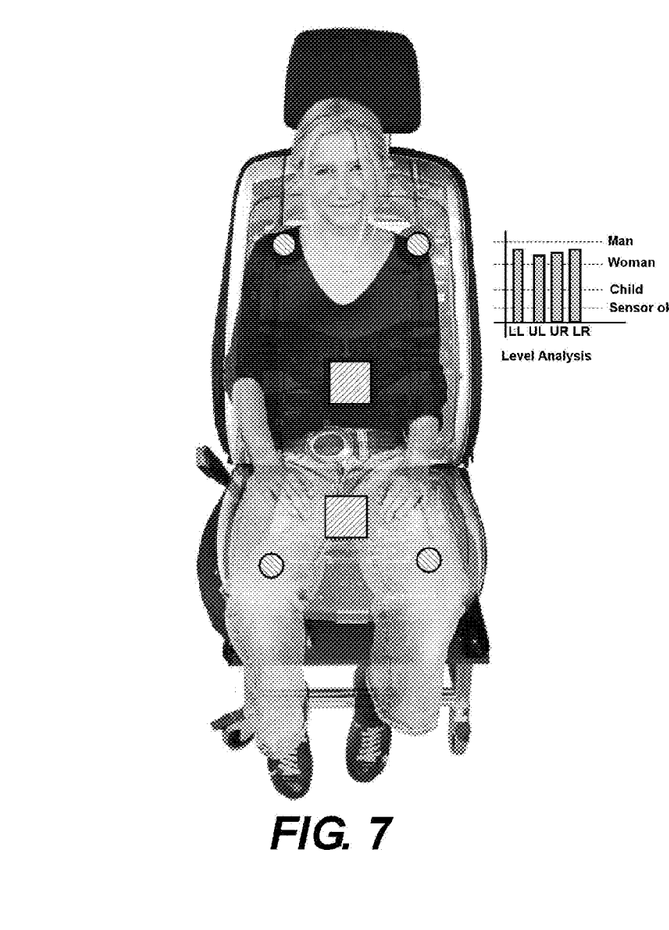
Figure 8:
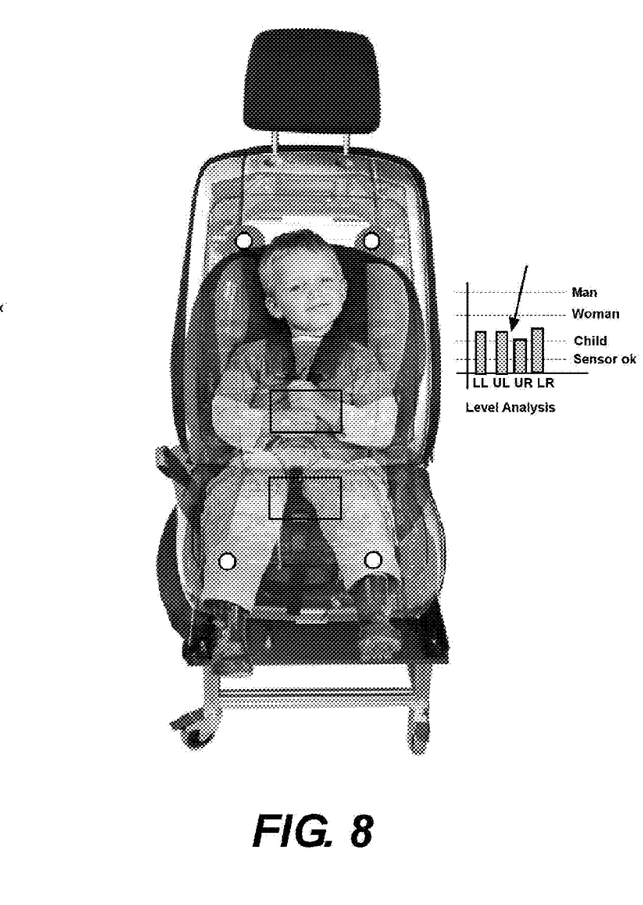
Figure 9:
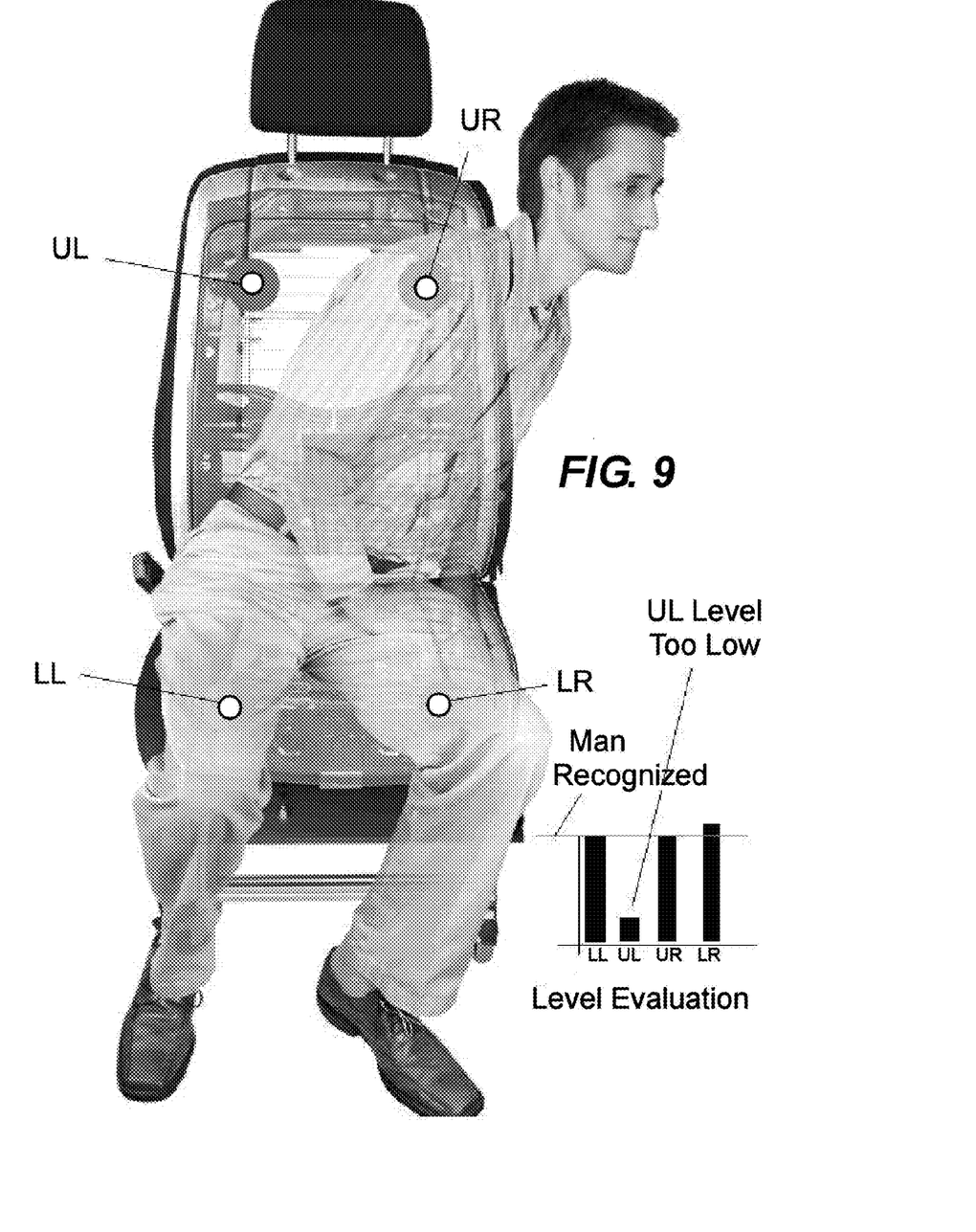

In a vehicle classified seat occupancy is to be carried out. This means that people of different weight can sit on the seat, which must be ascertained. Due to their weight these people push in the upholstery of a seat to various extents. If the person is distinguished by one or more server-side connections k as per the arrangement in FIG. 5 an electric alternating field, it can be brought into the region of the connections of the corresponding sensors via the human body, as FIG. 6 shows. The sensor clients are all switched to ground so that the incoming energy is dependent, depending on how near a person is to the sensor-connection. This in turn depends on his weight and his sitting position. by simple pattern analysis in the evaluation unit it can now be ascertained whether there is a woman (FIG. 7), a child (FIG. 8) or a man (FIG. 6)—depending on weight—sitting on this seat. Also, it can be ascertained whether this person is sitting symmetrically on the seat, or whether he or she has shifted the center of gravity (out of position) (FIG. 9). This is important, since the air-bag in a vehicle can be activated in particular only if the person is behaving as intended, though this is often not the case. Passengers who rest their legs on the dashboard or even hang them out the window in summer are e.g. frequently encountered. In this instance an air-bag may not be activated accidentally, which advantageously triggers the inventive subject. It is also possible to ascertain by the invention whether the person is moving his upper body and/or his head (head support tracking possible), or whether he has fastened his seat belt, and how he moves with this belt. Connections can also be placed in belts and upholstery via conductive fibers or conductive paint applications. A server can also exhibit several deconnections k that can be switched on or respectively off e.g. via a multiplexer.

Figure 10:
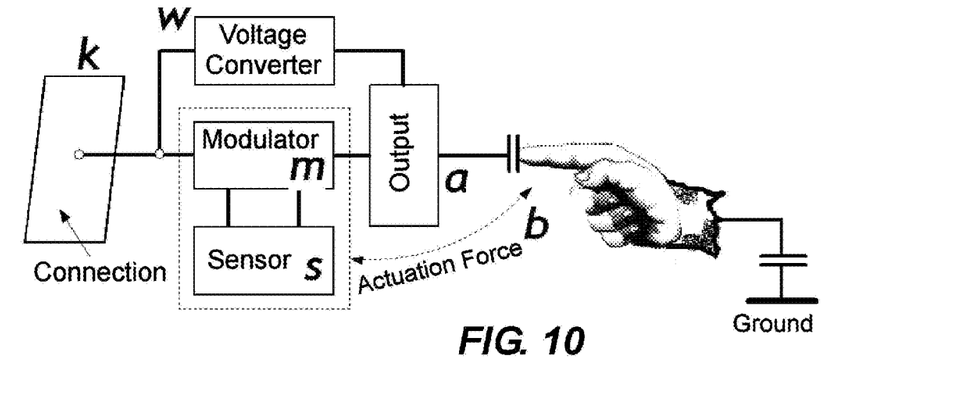

Another example of use will be shown in turn in a vehicle. Here it is possible to replace switches contact-free. Here it is possible to distinguish drivers and passengers from their manipulation. This happens by discharge surfaces being located e.g. in the seat pads in the respective console sides, to which feeding frequencies (from the server) can be delivered alternately. A driver or passenger absorbs these with his body and forwards them via his hands to at least one sensor-client via its coupling face (FIG. 10). The client reacts with its acoustic frequency that is ascertained next according to the invention; this can therefore be evaluated as touch control. The frequency can also be altered by the actuation force in height or level also enabling tactile feedback. In the event of adequate supply level it is possible to determine this from proximity to a simulated key (proximity detection), to switch on lights by touch control. The same applies for gearshift levers. Here too driver/passenger distinction is possible. It is also possible to determine the position of gearshift levers or to incorporate a type of joystick or glide pad in the knob of gearshift levers by the sensor clients, which can be operated by thumb. Such sensor clients could also be attached to pedals to determine actuation itself or actuation forces or dynamics of an actuation and transfer them to the evaluation unit. Transfer takes place via the human body, in particular via its skin (bodynet). The person thus practically forms the dielectric between the connections. According to the invention the above-described limiting resistor in the server r also ensures that no currents harmful to the person can occur. It is also possible using the sensor clients to carry out seat shifting, located for example on the middle console of a vehicle and alternately actuated by the driver and passenger, whereby the respective seat can be moved in this way. To set the different degree of liberty it is possible to incorporate several connections and/or capacitive faces in these adjustable switches that can change their position and/or distance from one another on actuation. A type of memory function can also be effected by the inventive sensors within an adjustable vehicle seat by the distances from different sensor clients being ascertained and stored (nominative-actual value comparison).

Mounting the inventive sensor clients in a vehicle steering wheel is also of particular significance. Rocker switches could be simulated here. It is also to be ascertained as to how and where a steering wheel is handled, or whether the knees are being used to steer. Driver and passenger distinction is likewise possible, as is actuation analysis, whereby the holding force of a person gives information on his sensitivities (tense, relaxed, etc.)

Figure 11:
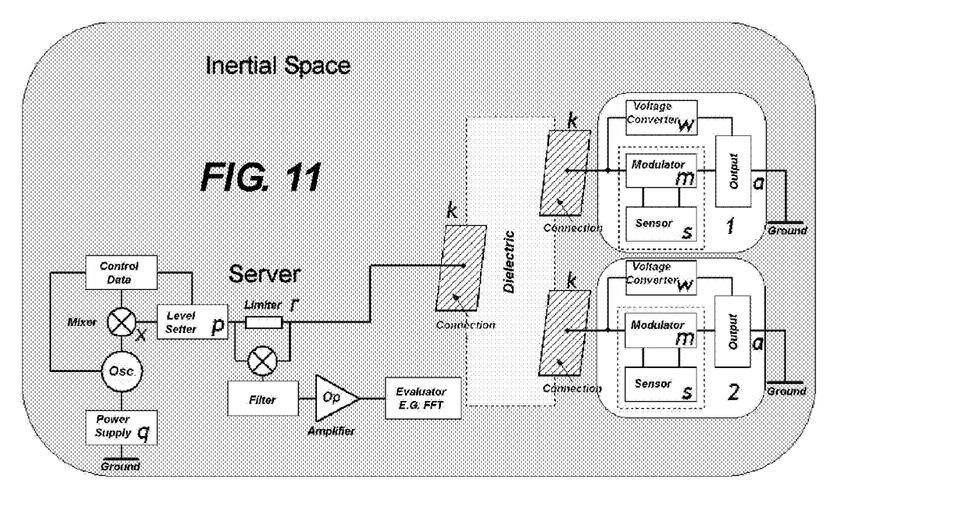

Another exemplary application is in e.g. "white goods" known to us as washing machines, dishwashers, ovens, microwaves, etc. Here the invention accomplishes two things. First, it can make operation easier by the inventive wireless clients being used in place of wired switches, keys, rotary switches, slide switches and grip switches. These are activated by proximity and/or touch of a person as FIG. 10 shows by way of example, and can accordingly easily be attached behind or on panels (e.g. adhered). This reduces manufacturing costs on the one hand, and on the other hand it solves problems involving watertightness. Conventional buttons and switches must pass through openings in a panel. It is difficult to make these watertight. A sensor network, which can determine whether flaps or valves are open or closed (off/on), can also be incorporated in a machine. It is also possible to ascertain whether parts such as e.g. lint filters are present or are missing. The throughflow and level and water states can also be measured. Speeds, direction of rotation, loading, vibration, etc. in often motor-driven appliances can easily be ascertained, since all these physical forces can cause changes in the feeding field strength, which in turn can have a direct effect on the delivered NF/LF oscillator level of a client. It is also possible to measure resistance temperatures by an NTC or PTC and to transmit them according to the invention. A detector can often transmit different physical sizes at the same time. The loading and vibration, etc. of an exemplary washing machine drum can be measured by a sensor, prior to and during operation. FIG. 11 shows the interplay between server and sensor clients.

Universal Use:

The invention is also suited for use in sports appliances to prove the intended use or the resulting physical sizes, or to prevent accidents or mitigate their consequences.

Finally, the invention could also be used in the medical technology field so as to supply implants provided with sensors (in the human or animal body) and/or to query their measured values or to make or initiate mechatronic adjustments from outside on the implant.

The inventive evaluation unit can also be provided remote from the level transmitter, but must be located in the field of influence of the alternating field.

Clients used as keys (as per FIG. 10) can also be connected directly or indirectly to ground, e.g. if the clients were attached on the outside to a metallic machine panel (optionally with earth potential). An alternating E field delivered by a server must be absorbed by the body of a person and be stored in the touched client when the connection k is touched (a dielectric can also be situated in between).

The invention claimed is:

1. A sensor system for generating control signals that are employed for setting switching states, whereby a user located in the vicinity of the sensor system functions as a signal-transmitting structure, the sensor system comprising:
   a first detector comprising a sensor, a local-key circuit and a signal-outputting circuit for generating a tell signal including data corresponding to a sensor event detected by the sensor,
   a second detector also comprising a sensor, a local-key circuit and a signal-outputting circuit for generating a tell signal including data corresponding to a sensor event detected by the sensor, and
   a signal requester comprising an interface that outputs seek signals into the user and receives tell signals from the user,
   the local-key circuit assigned to each detector being configured in such a way that the tell signal carries information content that enables assigning of the tell signal to the respective detectors.

2. The sensor system as claimed in claim 1 wherein the tell signal is time-offset from the seek signal.

3. The sensor system as claimed in claim 1 wherein the tell signal is emitted at least phase-wise at the same time as the seek signal.

4. The sensor system as claimed in claim 1 wherein the tell signal is routed back by impedance modulation to the interface of the signal seekers.

5. The sensor system as claimed in claim 1 wherein one of the detectors is addressed by the seek signal.

6. The sensor system as claimed in claim 1 wherein power is suppled to the detectors via the seek signal.

7. The sensor system as claimed in claim 1 wherein the sensor signal is generated by the seek signal.

8. The sensor system as claimed in claim 1 wherein at least one of the sensors is a pressure sensor.

9. The sensor system as claimed in claim 1 wherein at least one of the sensors is a proximity sensor.

10. The sensor system as claimed in claim 1 wherein the sensor system is integrated into a motor-vehicle seat or seating space.

11. The sensor system as claimed in claim 10 wherein the sensor system detects whether the seat is occupied.

12. The sensor system as claimed in claim 11 wherein an air-bag system is deployed according to detected seat occupancy.

13. The sensor system as claimed in claim 1 wherein the system comprises several signal requesters.

14. The sensor system as claimed in claim 1 wherein the system comprises a plurality of detectors.

15. The sensor system as claimed in claim 1 wherein the interface comprises a transmitter electrode and a receiver electrode, and that both electrodes are spaced from one another.

16. The sensor system as claimed in claim 1 wherein the local key of the respective detectors can be specified by the signal requester.

17. The sensor system as claimed in claim 1 wherein response characteristics of the detectors can be specified via the signal requester.

* * * * *